United States Patent
Chiang

(10) Patent No.: US 11,244,724 B2
(45) Date of Patent: Feb. 8, 2022

(54) CONTENT ADDRESSABLE MEMORY DEVICE

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/063,734

(22) Filed: Oct. 6, 2020

(65) Prior Publication Data

US 2021/0118505 A1 Apr. 22, 2021

(30) Foreign Application Priority Data

Oct. 21, 2019 (TW) .................................. 108137901

(51) Int. Cl.
| | |
|---|---|
| *G06F 7/02* | (2006.01) |
| *G11C 15/04* | (2006.01) |
| *G11C 8/12* | (2006.01) |
| *G11C 15/00* | (2006.01) |
| *G06F 16/903* | (2019.01) |

(52) U.S. Cl.
CPC .............. *G11C 15/04* (2013.01); *G11C 15/00* (2013.01); *G06F 7/02* (2013.01); *G06F 16/90339* (2019.01)

(58) Field of Classification Search
CPC G11C 15/04; G11C 15/00; G06F 7/02; G06F 16/90339
USPC ...... 365/49.11, 49.1, 189.07, 49.17; 711/108
See application file for complete search history.

(56) References Cited

U.S. PATENT DOCUMENTS

| | | | |
|---|---|---|---|
| 5,841,874 A | 11/1998 | Kempke et al. | |
| 5,930,359 A | 7/1999 | Kempke et al. | |
| 6,768,659 B2 | 7/2004 | Gillingham et al. | |
| 6,987,684 B1 | 1/2006 | Branth et al. | |
| 7,050,317 B1 | 5/2006 | Lien et al. | |
| RE40,932 E | 10/2009 | Diede et al. | |
| 2006/0181908 A1* | 8/2006 | Chan ..................... | G11C 15/00 365/49.12 |
| 2007/0247885 A1* | 10/2007 | Watanabe ............ | G11C 15/043 365/49.17 |

FOREIGN PATENT DOCUMENTS

| | | | | |
|---|---|---|---|---|
| CN | 107437425 A | * | 12/2017 | ............. G11C 15/00 |
| CN | 111933198 A | * | 11/2020 | |

* cited by examiner

*Primary Examiner* — Ly D Pham
(74) *Attorney, Agent, or Firm* — WPAT, PC

(57) ABSTRACT

A memory device includes a controller circuit, a first stage circuit, and a second stage circuit. The controller circuit outputs a first global pre-charge control signal, a second global pre-charge control signal, and a first local pre-charge control signal. The first stage circuit pre-charges a first global match line according to the first global pre-charge control signal, and to compare search data with first data, in order to determine whether to adjust a first level of the first global match line. The second stage circuit selectively pre-charges a second global match line according to the first level and the second global pre-charge control signal, and determines whether to compare the search data with second data according to a second level of the second global match line and the first local pre-charge control signal, in order to adjust the second level.

18 Claims, 4 Drawing Sheets

CONTENT ADDRESSABLE MEMORY DEVICE

BACKGROUND OF THE INVENTION

1. Field of the Invention

The present disclosure relates to a memory device, especially to a content addressable memory device that selectively performs pre-charging operation(s) by using a global match line and a local match line.

2. Description of Related Art

Content addressable memory devices provide a function of comparing data and a function of encoding address, in order to provide ability in high-speed data searching. However, in current approaches, in order to provide such ability, the content addressable memory devices are required to directly pre-charge multiple rows of memory in advance. As a result, unnecessary power consumption of the content addressable memory devices is caused, and negative impact(s) including electro-migration and an IR-drop are thus introduced, resulting in decreased performance of the memory devices.

SUMMARY OF THE INVENTION

In some embodiments, a memory device includes a controller circuit, a first stage circuit, and a second stage circuit. The controller circuit is configured to output a first global pre-charge control signal, a second global pre-charge control signal, and a first local pre-charge control signal. The first stage circuit is configured to pre-charge a first global match line according to the first global pre-charge control signal, and to compare search data with a plurality of first data, in order to determine whether to adjust a first level of the first global match line. The second stage circuit is configured to selectively pre-charge a second global match line according to the first level and the second global pre-charge control signal, and to determine whether to compare the search data with a plurality of second data according to a second level of the second global match line and the first local pre-charge control signal, in order to adjust the second level.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals. As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

For ease of understanding, like elements in various figures are designated with the same reference numbers.

Figure 1:
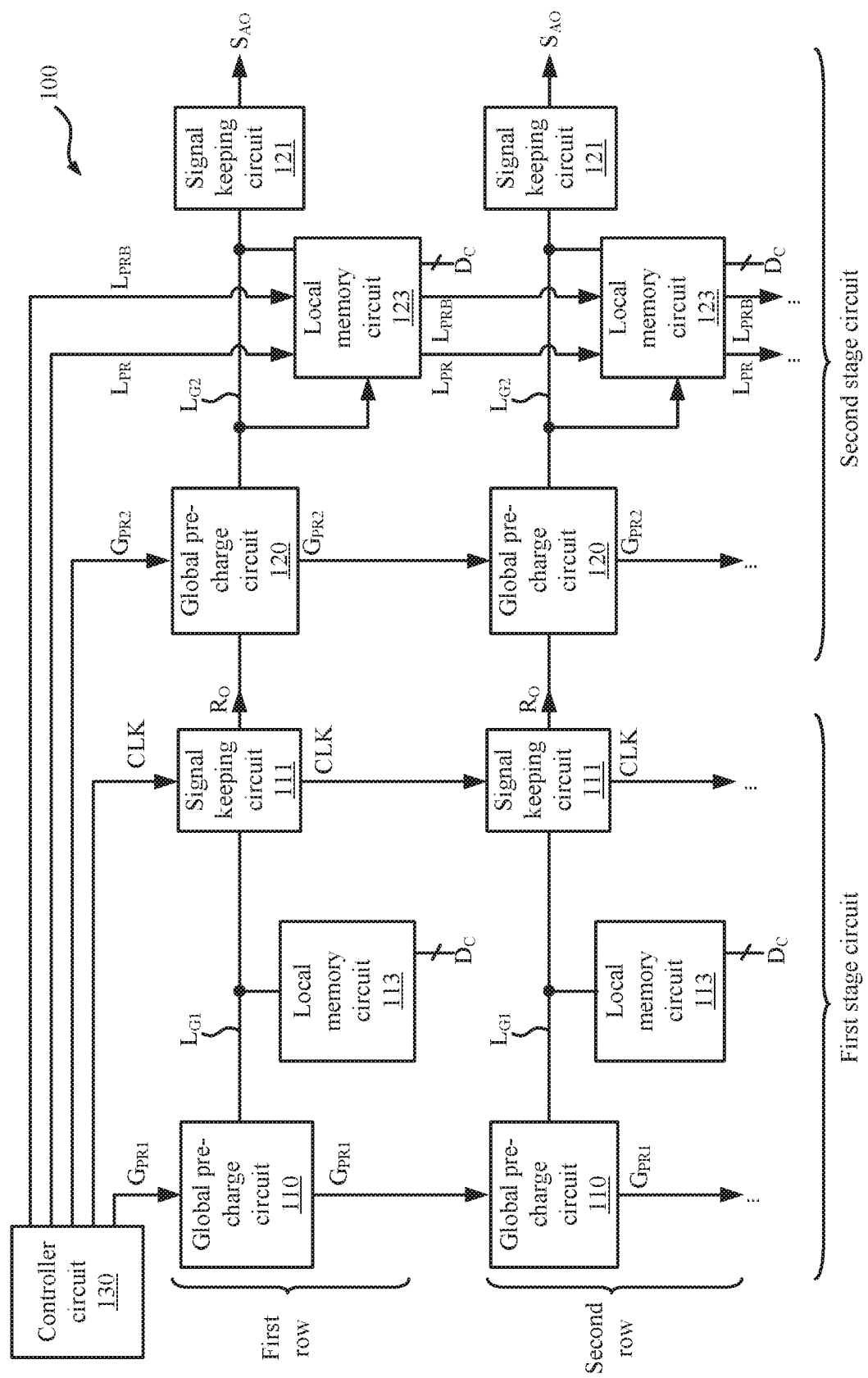
FIG. 1 illustrates a schematic diagram of a memory device according to some embodiments of the present disclosure.

FIG. 1 illustrates a schematic diagram of a memory device 100 according to some embodiments of the present disclosure. In some embodiments, the memory device 100 may be a content-addressable memory (CAM) device.

The memory device 100 includes rows of memory and a controller circuit 130, in which each row of memory includes two-stage circuit that are configured as a pipeline circuit. A first stage circuit is configured to compare search data $D_C$ with data stored in the first stage circuit (hereinafter referred to as "data $D_1$," as shown in the following FIG. 3), in order to determine whether to adjust a level of a global match line $L_{G1}$ (hereinafter referred to as "first level"). A second stage circuit is configured to selectively pre-charge a global match line $L_{G2}$ according to the first level and a global pre-charge control signal $G_{PR2}$, and to determine whether to compare the search data $D_C$ with data stored in the second stage circuit (hereinafter referred to as "data $D_2$," as shown in the following FIG. 4) according to a level of the global match line $L_{G2}$ (hereinafter referred to as "second level") and a local pre-charge control signal $L_{PR}$, in order to adjust the second level. With above configurations, energy losses from operations of the memory device 100 can be reduced, and impacts from an IR-drop and electro-migration of the memory device 100 can be significantly reduced.

Taking a first row of memory as an example, the first stage circuit includes a global pre-charge circuit 110, a local memory circuit 113, and a signal keeping circuit 111. The global pre-charge circuit 110 is coupled to the global match line $L_{G1}$, and is configured to pre-charge the global match line $L_{G1}$ according to a global pre-charge control signal $G_{PR1}$. As a result, the first level is pulled up to a high level (e.g., a level corresponding to a logic value of 1). The local memory circuit 113 is configured to store the data $D_1$, and to compare the search data $D_C$ with the data $D_1$ in order to determine whether to adjust the first level.

If the search data $D_C$ is matched with (i.e., the same as) the data $D_1$, the local memory circuit 113 does not adjust the first level. Under this condition, the first level is kept as the high level, in order to indicate that the search data $D_C$ is stored in the local memory circuit 113. Alternatively, if the search data $D_C$ is not matched with (i.e., is different from) the data $D_1$, the local memory circuit 113 discharges the global match line $L_{G1}$, in order to pull down the first level to a low level (e.g., a level corresponding to a logic value of 0). Under this condition, the first level is able to indicate that the search data $D_C$ is not stored in the local memory circuit 113.

The signal keeping circuit 111 is configured to keep the first level and to generate an enable signal $R_O$ according to the first level and a clock signal CLK. In some embodiments, the signal keeping circuit 111 may be implemented with a register circuit, a flip flop circuit, or a latch circuit. For example, the signal keeping circuit 111 may be (but not limited to) a D-type flip flop circuit that outputs the enable signal $R_O$ according to the clock signal CLK.

The second stage circuit includes a global pre-charge circuit 120, a local memory circuit 123, and a signal keeping circuit 121.

The global pre-charge circuit 120 is coupled to the global match line $L_{G2}$, and is configured to determine whether to pre-charge the global match line $L_{G2}$ according to the enable signal $R_O$ and the global pre-charge control signal $G_{PR2}$. In some embodiments, if the search data $D_C$ is matched with the data $D_1$, the global pre-charge circuit 120 pre-charges the global match line $L_{G2}$. If the search data $D_C$ is not matched with the data $D_1$, the global pre-charge circuit 120 does not pre-charge the global match line $L_{G2}$.

In greater detail, if the search data $D_C$ is matched with the data $D_1$, the first level is the high level. In response to this first level, the signal keeping circuit 111 outputs the enable signal $R_O$ having the logic value of 1. In response to the global pre-charge control signal $G_{PR2}$ and the enable signal $R_O$ having the logic values of 1, the global pre-charge circuit 120 pre-charges the global match line $L_{G2}$, in order to pull up the second level to the high level.

Alternatively, if the search data $D_C$ is not matched with the data $D_1$, the first level is the low level. In response to this first level, the signal keeping circuit 111 outputs the enable signal $R_O$ having the logic value of 0. Regardless of the logic value of the global pre-charge control signal $G_{PR2}$, the global pre-charge circuit 120 does not pre-charge the global match line $L_{G2}$ in response to the enable signal $R_O$ having the logic value of 0, and pulls down the second level to the low level.

The local memory circuit 123 is coupled to the global match line $L_{G2}$, and is configured to be selectively enabled according to the second level, in order to adjust the second level according to the local pre-charge control signal $L_{PR}$. In some embodiments, when the local memory circuit 123 is enabled, the local memory circuit 123 performs the pre-charging operation according to the local pre-charge control signal $L_{PR}$, and determines whether to adjust the second level according to the search data $D_C$. In some embodiments, when the local memory circuit 123 is not enabled, the local memory circuit 123 does not perform the pre-charging operation, and keeps the second level according to a local pre-charge control signal $L_{PRB}$. As shown in the following FIG. 2, the local pre-charge control signal $L_{PRB}$ is inversed to the local pre-charge control signal $L_{PR}$. The detailed descriptions regarding herein will be given with reference to FIG. 2 and FIGS. 4A-4B.

The signal keeping circuit 121 is coupled the global match line $L_{G2}$. The functions and the implementations of the signal keeping circuit 121 are similar to those of the signal keeping circuit 111. The signal keeping circuit 121 is configured to keep the second level, and generate an address signal $S_{AO}$ according to the second level. The address signal $S_{AO}$ is for indicating whether the data stored in the first row of memory are matched with the search data $D_C$. In some embodiments, the memory device 100 may further include a sense amplifier (not shown) that is configured to amplify the address signal $S_{AO}$ outputted from the signal keeping circuit 121. In some embodiments, the memory device 100 may further include a codec circuit (not shown) that is able to generate an address according to the address signal $S_{AO}$ of each row, in which the address is for indicating a memory location where the search data $D_C$ is stored.

The controller circuit 130 is configured to output the clock signal CLK, the global pre-charge control signal $G_{PR1}$, the global pre-charge control signal $G_{PR2}$, the local pre-charge control signal $L_{PR}$, and the local pre-charge control signal $L_{PRB}$, in order to control pre-charging operation of each row of memory. In some embodiments, the controller circuit 130 may be implemented with logic circuit(s), micro-controller circuit, or digital signal processing circuit(s), but the present disclosure is not limited thereto.

In some embodiments, in a layout design, signal paths for the controller circuit 130 to transmit the control signals may be implemented with wires arranged in a vertical direction. In other words, the memory device 100 is able to perform the pre-charging operation(s) without utilizing control signals that are transmitted through wires arranged in a horizontal direction. As described below, various control signals are able to be transmitted via the match lines, in order to perform the pre-charging operation(s) or evaluating operation(s). As a result, a compact memory array can be achieved, in order to have lower circuit area.

The number of the circuits shown in FIG. 1 is given for illustrative purposes only, and the present disclosure is not limited thereto. In some embodiments, operations of the memory device 100 may be performed without utilizing the signal keeping circuit 111, the signal keeping circuit 121, and/or the sense amplifier. In some embodiments, the memory device 100 may include more rows of memory (not shown), in which each row of memory has the same circuit architecture. In some embodiments, each row of memory includes more stages of circuit (not shown), in which these stages of circuit (except the first stage) has the same circuit architecture. In some embodiments, the memory device 100 may further includes a read/write controller circuit (not shown), in order to perform read/write operations with memory cells (e.g., CAM cell 113-2 and/or CAM cell 123-2 as described below) in the row of memory.

Figure 2:
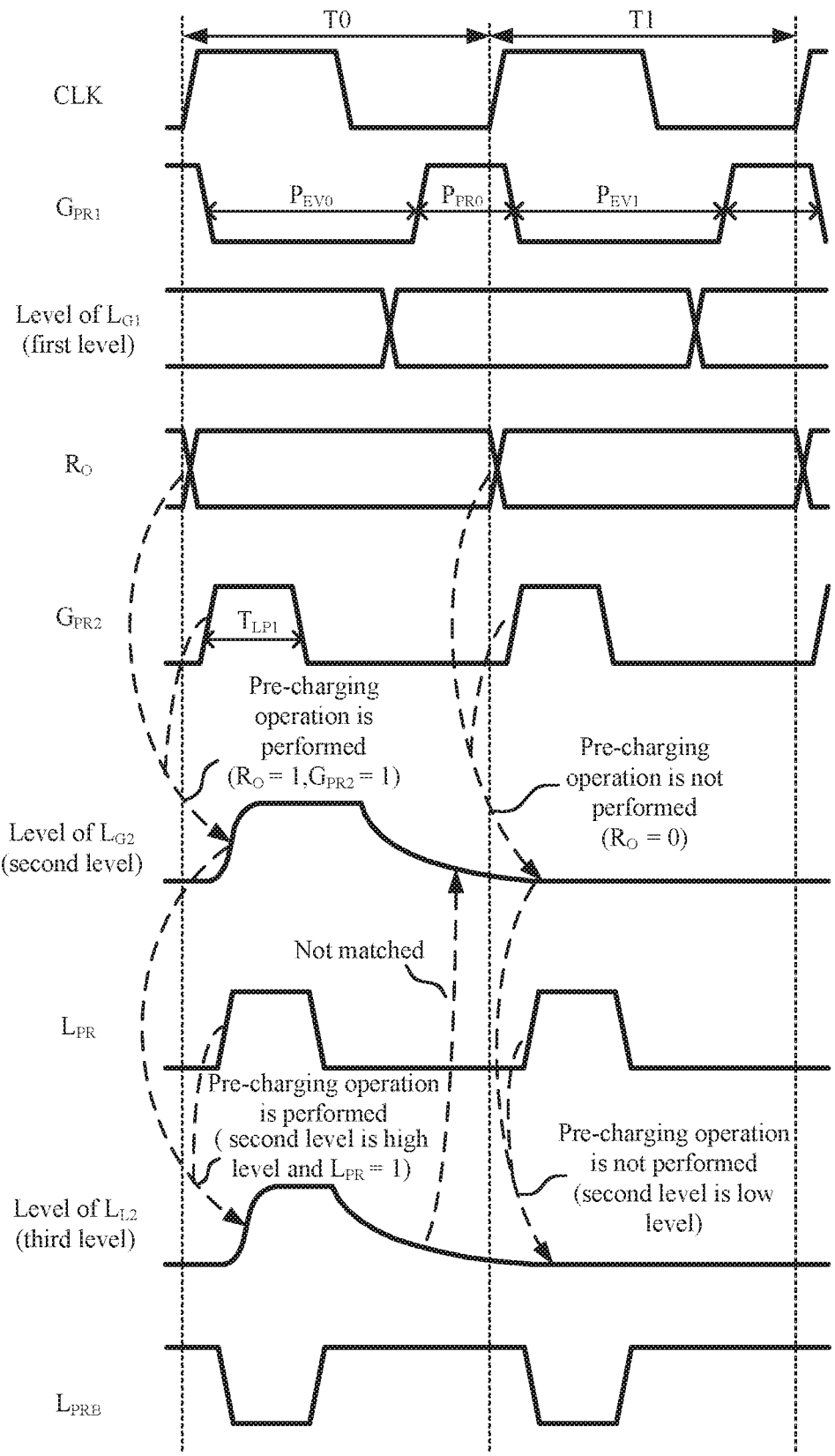
FIG. 2 illustrates a waveform diagram of signals in the memory device of FIG. 1 according to some embodiments of the present disclosure.

FIG. 2 illustrates a waveform diagram of signals in the memory device 100 of FIG. 1 according to some embodiments of the present disclosure. Reference is made to both of FIG. 1 and FIG. 2, and operations of the memory device 100 shown in FIG. 1 are described with reference to FIG. 1.

In view of the first stage circuit, during a time interval T0, the first stage circuit enters an evaluation phase $P_{EV0}$ in response to the global pre-charge control signal $G_{PR1}$. In the evaluation phase $P_{EV0}$, the local memory circuit 113 determines whether to adjust the first level according to the search data $D_C$. The signal keeping circuit 111 outputs the enable signal $R_O$ according to the clock signal CLK and the first level. In this example, the local memory circuit 113 determines that the search data $D_C$ is not matched with the data $D_1$, and thus the enable signal $R_O$ has the logic value of 0. After the evaluation phase $P_{EV0}$, the first stage circuit enters a pre-charge phase $P_{PR0}$.

In this example, in the previous evaluation phase (not shown), the local memory circuit 113 determined that the search data $D_C$ is matched with the data $D_1$, and thus the enable signal $R_O$ has the logic value of 1. In view of the second stage circuit, during the time interval T0, the global pre-charge circuit 120 pre-charges the global match line $L_{G2}$ in response to the global pre-charge control signal $G_{PR2}$ and the enable signal $R_O$ having the logic values of 1, in order to pull up the second level to the high level. Next, in response to the local pre-charge control signal $L_{PR}$ having the logic value of 1 and this second level, the local memory circuit 123 is enabled to perform the pre-charging operation, in order to pull up a level of a local match line $L_{L2}$ in the following FIG. 4A (hereinafter referred to as "third level"). In this example, the local memory circuit 123 determines that the search data $D_C$ is not matched with data stored in the local memory circuit 123, and thus pulls down the third level and the second level to the low level. As shown in FIG. 2, during a time interval $T_{LP1}$ when the second stage circuit performs the pre-charging operation, the first stage circuit compares the search data $D_C$ with the data $D_1$ in the evaluation phase $P_{EV0}$. During the evaluation phase when the second stage circuit compares the search data $D_C$ with data $D_2$, the first stage circuit performs the pre-charging operation in the pre-charge phase $P_{PR0}$.

During a time interval T1, in response to the global pre-charge control signal $G_{PR1}$, the first stage circuit enters an evaluation phase $P_{EV1}$. The local memory circuit 113 determines whether to adjust the first level according to the search data $D_C$. After the evaluation phase $P_{EV1}$, the first stage circuit enters a pre-charge phase $P_{PR1}$.

In view of the second stage circuit, during the time interval T1, the global pre-charge circuit 120 does not pre-charge the global match line $L_{G2}$ in response to the enable signal $R_O$ having the logic value of 0 (which is the same as the first level in the previous time interval T0), and thus the second level is kept as the low level corresponding to the logic value of 0. Next, in response to the enable signal $R_O$ having the logic value of 0, the local memory circuit 123 is not enabled and thus does not perform the pre-charging operation, and the third level is unchanged.

Each of the time interval T0 and the time interval T1 is corresponding to one period of the clock signal CLK. It can be understood that, based on FIG. 2, in each period of the clock signal CLK, a time interval when the first stage circuit performs the pre-charging operation (i.e., the global match line $L_{G1}$ is pre-charged) is different from the time interval $T_{LP1}$ when the second stage circuit performs the pre-charging operation (i.e., the global match line $L_{G2}$ is pre-charged). When the first stage circuit performs the pre-charging operation (i.e., the global match line $L_{G1}$ is pre-charged), the second stage circuit selectively determines whether the search data $D_C$ is matched with the data $D_2$. As a result, a current generated from the memory device 100 at the same time can be reduced significantly, and thus impact(s) from the IR-drop and the electro-migration can be reduced. Moreover, as the second stage circuit is configured to selectively perform the pre-charging operation according to the first level generated by the first stage circuit at the previous interval, dynamic power consumption of the second stage circuit can be further reduced.

Figure 3:
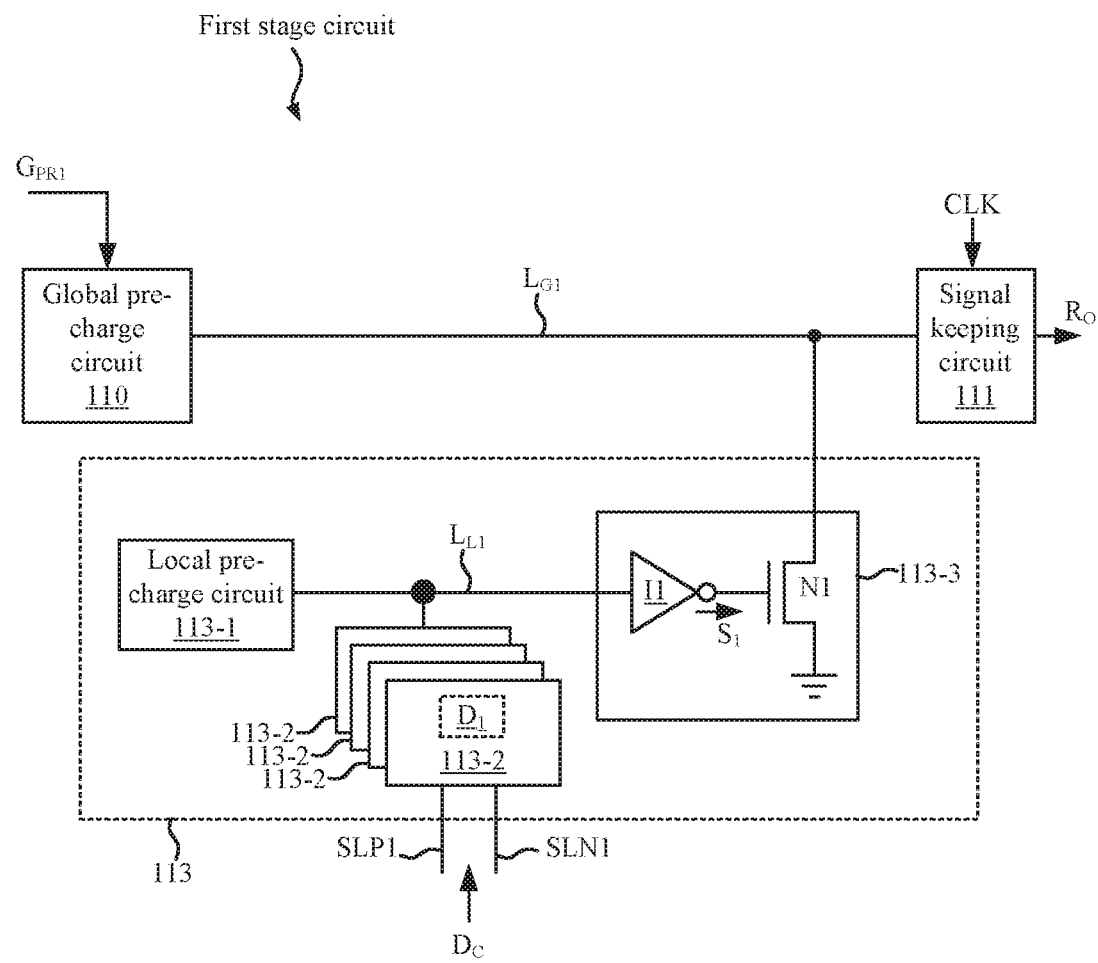
FIG. 3 illustrates a circuit diagram of the first stage circuit in FIG. 1 according to some embodiments of the present disclosure.

FIG. 3 illustrates a circuit diagram of the first stage circuit in FIG. 1 according to some embodiments of the present disclosure. In some embodiments, the local memory circuit 113 includes a local pre-charge circuit 113-1, CAM cells 113-2, and a switching circuit 113-3.

The local pre-charge circuit 113-1 is configured to pre-charge the local match line $L_{L1}$, in order to pull up the local match line $L_{L1}$ to the high level. The CAM cells 113-2 are coupled to the local match line $L_{L1}$. In some embodiments, the CAM cell 113-2 includes a storage component for storage the data $D_1$, and a comparison circuit for comparing the data $D_1$ with the search data $D_C$.

Each of the CAM cells 113-2 receives the search data $D_C$ via a bit line $S_{LP1}$ and a bit line $S_{LN1}$, and determines whether the search data $D_C$ is matched with the data $D_1$, in order to selectively adjust the level of the local match line $L_{L1}$. For example, if each CAM cell 113-2 determines that the search data $D_C$ is matched with the data $D_1$, the level of the local match line $L_{L1}$ is kept as the high level. Alternatively, if a first CAM cell of the CAM cells 113-2 determines that the search data $D_C$ is not matched with the data $D_1$, the first CAM cell 113-2 pulls down the level of the local match line $L_{L1}$ to the low level. In some embodiments, operation(s) of the CAM cell 113-2 can be understood with reference to current NOR CAM cells, but the present disclosure is not limited thereto.

The switching circuit 113-3 is coupled to the local match line $L_{L1}$ and the global match line $L_{G1}$, and is configured to determine whether to adjust the first level according to the level of the local match line $L_{L1}$. In some embodiments, the switching circuit 113-3 includes an inverter I1 and a transistor N1. The inverter I1 outputs a control signal $S_1$ according to the level of the local match line $L_{L1}$. The transistor N1 is coupled between the global match line $L_{G1}$ and ground, and is configured to be selectively turned on according to the control signal $S_1$, in order to determine whether to adjust the first level.

For example, if the level of the local match line $L_{L1}$ is the high level, the inverter I1 outputs the control signal $S_1$ having the logic value of 0. Under this condition, the transistor N1 is not turned on, and thus does not adjust the first level. Alternatively, if the level of the local match line $L_{L1}$ is the low level, the inverter I1 outputs the control signal $S_1$ having the logic value of 1. Under this condition, the transistor N1 is turned on to pull down the first level to the low level (e.g., a ground level).

The number of components in FIG. 3 is given for illustrative purposes, and the present disclosure is not limited thereto. In some embodiments, the first stage circuit may include more the local memory circuits 113 that are coupled to the same global match line $L_{G1}$.

Figure 4A:
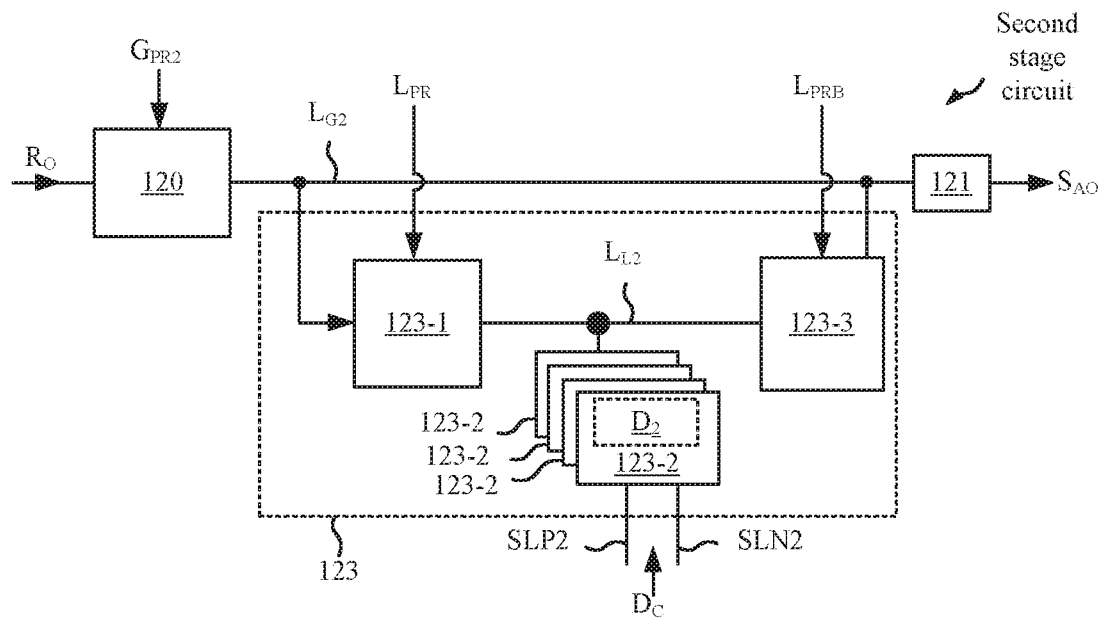
FIG. 4A illustrates a circuit diagram of the second stage circuit in FIG. 1 according to some embodiments of the present disclosure.

FIG. 4A illustrates a circuit diagram of the second stage circuit in FIG. 1 according to some embodiments of the present disclosure. In some embodiments, the local memory circuit 123 includes a local pre-charge circuit 123-1, CAM cells 123-2, and a protection circuit 123-3.

The local pre-charge circuit 123-1 is coupled to the local match line $L_{L2}$, and is configured to determine whether to pre-charge the local match line $L_{L2}$ according to the second level and the local pre-charge control signal $L_{PR}$. For example, when the second level is the high level and the local pre-charge control signal $L_{PR}$ has the logic value of 1, the local pre-charge circuit 123-1 pre-charges the local match line $L_{L2}$, in order to pull up the third level to the high level. Under other conditions (for example, the second level is the low level or the local pre-charge control signal $L_{PR}$ has the logic value of 0), the local pre-charge circuit 123-1 does not pre-charge the local match line $L_{L2}$.

The CAM cells 123-2 are coupled to the local match line $L_{L2}$ and are configured to store the data $D_2$. Each of the CAM cells 123-2 receives the search data $D_C$ via a bit line SLP2 and a bit line SLN2, and compares the search data $D_C$ with the data $D_2$, in order to selectively adjust the third level. For example, if each CAM cell 123-2 determines that the search data $D_C$ is matched with the data $D_2$, the third level is kept as the high level; alternatively, if a first CAM cell 123-2 of CAM cells 123-2 determines that the search data $D_C$ is matched with the data $D_2$, the first CAM cell 123-2 pulls down the third level to the low level. In some embodiments, operation(s) of the CAM cell 123-2 can be understood with reference to those of the current NOR CAM cell, but the present disclosure is not limited thereto.

The protection circuit 123-3 is coupled to the local match line $L_{L2}$ and the global match line $L_{G2}$, and to adjust the second level according to the third level and the local pre-charge control signal $L_{PRB}$. The protection circuit 123-3 is further configured to provide a leakage current protection to the global match line $L_{G2}$, in order to prevent the second level from being changed erroneously. The detailed descriptions regarding herein are given in the following paragraphs with reference to FIG. 4B.

Figure 4B:
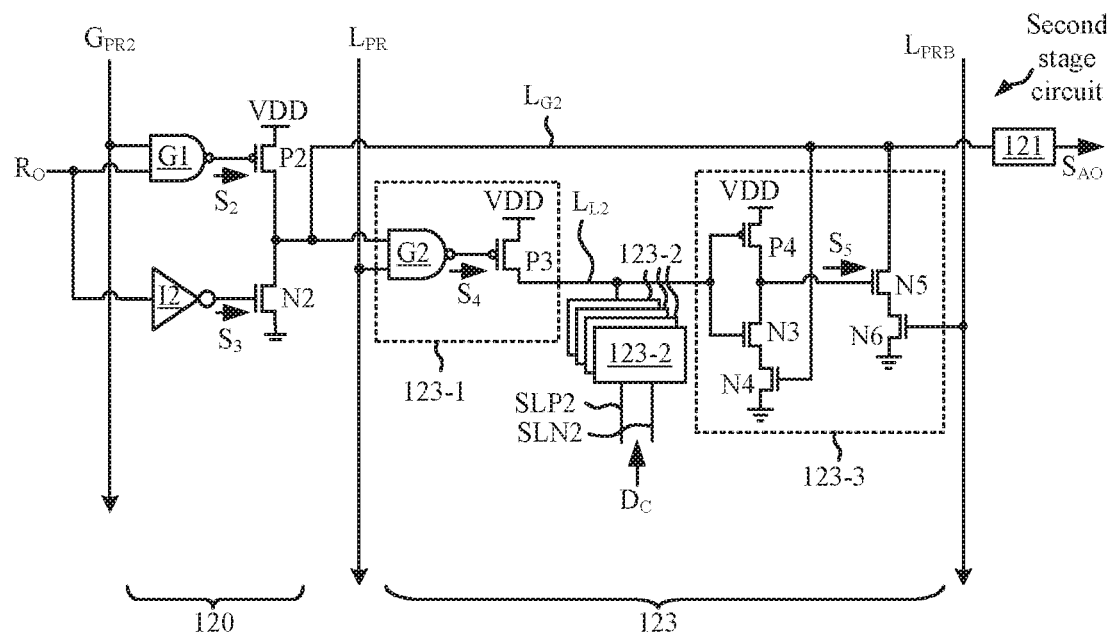
FIG. 4B illustrates a detailed circuit diagram of the second stage circuit in FIG. 4A according to some embodiments of the present disclosure.

FIG. 4B illustrates a detailed circuit diagram of the second stage circuit in FIG. 4A according to some embodiments of the present disclosure. The global pre-charge circuit 120 includes a logic gate G1, an inverter I2, a transistor P2, and a transistor N2. Under a condition that the search data $D_C$ is matched with the data $D_1$ (i.e., when the first stage circuit determines not to adjust the first level according to the search data $D_C$), the logic gate G1 outputs a control signal $S_2$ according to the global pre-charge control signal $G_{PR2}$. For example, the logic gate G1 may be (but not limited to) an NAND gate, and this NAND gate is able to output the control signal $S_2$ according to the enable signal $R_O$ and the global pre-charge control signal $G_{PR2}$. The transistor P2 and the transistor N2 are coupled in series to adjust the second level.

In greater detail, a first terminal of the transistor P2 is configured to receive a voltage VDD, a second terminal of the transistor P2 is coupled to the global match line $L_{G2}$, and a control terminal of the transistor P2 is configured to receive the control signal $S_2$. The transistor P2 is turned on according to the control signal $S_2$, in order to pre-charge the global match line $L_{G2}$. For example, when both of the enable signal $R_O$ and the global pre-charge control signal $G_{PR2}$ have the logic values of 1, the control signal $S_2$ has the logic value of 0. Under this condition, the transistor P2 is turned on to transmit the voltage VDD to the global match line $L_{G2}$, in order to pull up the second level to the high level (e.g., the level of the voltage VDD).

The inverter I2 outputs a control signal $S_3$ according to the enable signal $R_O$. A first terminal of the transistor N2 is coupled to the global match line $L_{G2}$, a second terminal of the transistor N2 is coupled to ground, and a control terminal of the transistor N2 is configured to receive the control signal $S_3$. The transistor N2 is turned on according to the control signal $S_3$, in order to pull down the second level to the low level. For example, when the enable signal $R_O$ has the logic value of 0, the control signal $S_3$ has the logic value of 1. Under this condition, the transistor N2 is turned on to pull down the second level.

The local pre-charge circuit 123-1 includes a logic gate G2 and a transistor P3. If the second stage circuit pre-charges the global match line $L_{G2}$, the logic gate G2 outputs a control signal $S_4$ according to the local pre-charge control signal $L_{PR}$. For example, the logic gate G2 may be (but not limited to) implemented with an NAND gate, and this NAND gate may output the control signal $S_4$ according to the enable signal $R_O$ and the local pre-charge control signal $L_{PR}$. A first terminal of the transistor P3 is configured to receive the voltage VDD, a second terminal of the transistor P3 is coupled to the local match line $L_{L2}$, and a control terminal of the transistor P3 is configured to receive the control signal $S_4$. The transistor P3 is turned on according to the control signal $S_4$, in order to pre-charge the local match line $L_{L2}$. For example, when the second level is the high level and the local pre-charge control signal $L_{PR}$ has the logic value of 1, the control signal $S_4$ has the logic value of 0. Under this condition, the transistor P3 is turned on to transmit the voltage VDD to the local match line $L_{L2}$, in order to pull up the third level to the high level.

The protection circuit 123-3 includes transistors N3-N6 and P4, in which the transistors P4 and N3 operate as an inverter and are configured to generate a control signal $S_5$ according to the third level.

In greater detail, a first terminal of the transistor P4 is configured to receive the voltage VDD, a second terminal of the transistor P4 is configured to output the control signal $S_5$, and a control terminal of the transistor P4 is coupled to the local match line $L_{L2}$. A first terminal of the transistor N3 is coupled to the second terminal of the transistor P4, and a control terminal of the transistor N3 is coupled to the local match line $L_{L2}$. A first terminal of the transistor N4 is coupled to a second terminal of the transistor N3, a second terminal of the transistor N4 is coupled to ground, and a control terminal of the transistor N4 is coupled to the global match line $L_{G2}$. The transistor N4 is configured to be selectively turned on according to the second level. A first terminal of the transistor N5 is coupled to the local match line $L_{L2}$, and a control terminal of the transistor N5 is configured to receive the control signal $S_5$. The transistor N5 is configured to be selectively turned on according to the control signal $S_5$. A first terminal of the transistor N6 is coupled to a second terminal of the transistor N5, a second transistor N6 is coupled to ground, and a control terminal of the transistor N6 is configured to receive the local pre-charge control signal $L_{PRB}$. The transistor N6 is configured to be selectively turned on according to the local pre-charge control signal $L_{PRB}$.

Under a condition that the second level is the high level and the third level is the high level (i.e., the search data $D_C$ is matched with the data $D_2$), the transistors N3 and N4 are turned on and the transistor P4 is turned off, in order to output the control signal $S_5$ having the logic value of 0. The transistor N5 is turned off in response to the control signal $S_5$, in order to ensure that the second level is not affected. As a result, the second level is kept as the high level, in order to indicate that the search data $D_C$ is stored in the local memory circuit 123.

Alternatively, under a condition that the second level is the high level and the third level is the low level (i.e., the search data $D_C$ is not matched with the data $D_2$), the transistor P4 is turned on and the transistor N3 is turned off, in order to output the control signal $S_5$ having the logic value of 1. The transistor N5 is turned on in response to the control signal $S_5$, and the transistor N6 is turned on in response to the local pre-charge control signal $L_{PRB}$, in order to pull down the second level to the low level. As a result, this second level is able to indicate that the search data $D_C$ is not stored in the local memory circuit 123.

Furthermore, as described above, if the second level is the low level or if the local pre-charge control signal $L_{PR}$ has the logic value of 0, the local pre-charge circuit 123-1 does not pre-charge the local match line $L_{L2}$. Under this condition, the third level and the logic value of the control signal $S_5$ may be floating. The transistor N4 is turned off according to the second level, in order to cut off a potential leakage path (e.g., a path between the transistors N3 and N4) that may be erroneously turned on according to the floating level of the local match line $L_{L2}$. Similarly, the transistor N6 is turned off according to the local pre-charge control signal $L_{PRB}$ having the logic value of 0, in order to cut off a potential leakage path (e.g., the transistor N5) that may be erroneously turned on according to the floating logic value of the control signal $S_5$.

Moreover, when the memory device 100 further includes a third stage circuit (not shown), and the third stage circuit and the second stage circuit have the same circuit architecture, and are coupled to the same global match line $L_{G2}$. When the local match line $L_{L2}$ in the second stage circuit has the high level (i.e., the search data $D_C$ is matched with the data $D_2$ stored in the second stage circuit) and the local match line $L_{L2}$ in the third stage circuit has the low level (i.e., the search data $D_C$ is not matched with the data $D_2$ stored in the third stage circuit), the second level is pulled down to the low level. Under this condition, the transistor N4 in the second stage circuit is turned on, such that the control signal $S_5$ may be floating. In the third stage circuit, the transistor P4 is turned on to generate the control signal $S_5$ having the logic value of 1, the transistor N5 is turned on in response to the control signal $S_5$, and the transistor N6 is turned on in response to the local pre-charge control signal $L_{PRB}$, in order to ensure that the second level can be correctly pulled down. As a result, impacts from the floating control signal $S_5$ of the second stage circuit can be prevented.

Alternatively, when the local match line $L_{L2}$ in each of the second stage circuit and the third stage circuit has the high level, the global match line $L_{G2}$ is kept as the high level. Under this condition, the transistors N3 and N4 in each stage circuit are turned on to generate the control signal $S_5$ having the logic value of 0. As a result, the transistor N5 is turned off, in order to keep the level of the global match line $L_{G2}$. With the leakage current protection operations of the protection circuit 123-3, the memory device 100 is able to correctly operate at each phase.

The number of circuits in FIG. 4A and FIG. 4B is given for illustrative purposes, and the present disclosure is not limited thereto. In some embodiments, the second stage circuit may include more local memory circuit 123 that are coupled to the same global match line $L_{G2}$.

As described above, the memory device provided in some embodiments of the present disclosure is able to perform pre-charging operations and evaluation operations of multiple stage circuits at different time intervals, and the pre-charging operation of a next stage circuit is selectively performed according to a matched result of the previous stage circuit. As a result, the power consumption and impacts from the electro-migration of the memory device can be significantly reduced. Moreover, a protection circuit is provided in some embodiments, in order to provide a leakage protection to the aforementioned mechanism of selectively pre-charging to ensure that the memory device operates properly. In addition, with the above control mechanism, the control signals sent from the controller circuit are transmitted via the global match line(s) and/or the local match line(s) in each stage circuit, in order to perform the aforementioned operations at different time intervals. As a result, the circuit area of the memory device can be saved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory device, comprising:
   a controller circuit configured to output a first global pre-charge control signal, a second global pre-charge control signal, and a first local pre-charge control signal;
   a first stage circuit configured to pre-charge a first global match line according to the first global pre-charge control signal, and to compare search data with a plurality of first data, in order to determine whether to adjust a first level of the first global match line; and
   a second stage circuit configured to selectively pre-charge a second global match line according to the first level and the second global pre-charge control signal, and to determine whether to compare the search data with a plurality of second data according to a second level of the second global match line and the first local pre-charge control signal, in order to adjust the second level.

2. The memory device of claim 1, wherein the second stage circuit comprises:
   a global pre-charge circuit configured to determine whether to pre-charge the second global match line according to the first level and the second global pre-charge control signal; and
   a local memory circuit configured to be selectively enabled according to the second level to compare the search data with the plurality of second data according to the first local pre-charge control signal, in order to adjust the second level.

3. The memory device of claim 2, wherein the global pre-charge circuit comprises:
   a logic gate, wherein when the first stage circuit determines not to adjust the first level according to the search data, the logic gate is configured to output a first control signal according to the second global pre-charge control signal;
   an inverter configured to output a second control signal according to the first level;

a first transistor configured to be turned on according to the first control signal, in order to pre-charge the second global match line; and a second transistor configured to be turned on according to the second control signal, in order to pull down the second level.

4. The memory device of claim 2, wherein the local memory circuit comprises:

a local pre-charge circuit configured to determine whether to pre-charge a local match line according to the second level and the first local pre-charge control signal;

a plurality of content addressable memory cells configured to store the plurality of second data, and to compare the search data with the plurality of second data, in order to determine whether to adjust a third level of the local match line; and a protection circuit configured to adjust the second level according to the third level and a second local pre-charge control signal, and to provide a leakage protection to the second global match line.

5. The memory device of claim 4, wherein the local pre-charge circuit comprises:

a logic gate, wherein when the second stage circuit pre-charges the second global match line, the logic gate is configured to generate a control signal according to the first local pre-charge control signal; and a transistor configured to be turned on according to the control signal, in order to pre-charge the local match line.

6. The memory device of claim 4, wherein the protection circuit comprises:

a first transistor;

a second transistor, wherein the first transistor and the second transistor are configured to operate as an inverter, and to generate a control signal according to the third level;

a third transistor coupled between the second transistor and ground, and configured to be selectively turned on according to the second level;

a fourth transistor configured to be selectively turned on according to the control signal; and a fifth transistor coupled to the fourth transistor and ground, and configured to be selectively turned on according to the second local pre-charge control signal, wherein the fourth transistor is coupled between the second global match line and the fifth transistor.

7. The memory device of claim 4, wherein the first local pre-charge control signal is inversed to the second local pre-charge control signal.

8. The memory device of claim 4, wherein when the search data is not matched with the plurality of first data, the local pre-charge circuit does not pre-charge the local match line.

9. The memory device of claim 2, wherein when the search data is not matched with the plurality of second data, the local memory circuit pulls down the second level.

10. The memory device of claim 2, wherein when the search data is matched with the plurality of second data, the local memory circuit keeps the second level.

11. The memory device of claim 1, wherein the first stage circuit comprises:

a global pre-charge circuit configured to pre-charge the first global match line according to the first global pre-charge control signal; and a local memory circuit configured to store the plurality of first data, and to compare the search data with the plurality of first data, in order to determine whether to adjust the first level.

12. The memory device of claim 11, wherein when the search data is not matched with the first data, the local memory circuit pulls down the first level.

13. The memory device of claim 11, wherein when the search data is matched with the first data, the local memory circuit keeps the first level.

14. The memory device of claim 1, wherein when the first stage circuit compares the search data with the plurality of first data, the second stage circuit selectively pre-charges the second global match line.

15. The memory device of claim 1, wherein a time interval when the first global match line is pre-charged is different from a time interval when the second global match line is pre-charged.

16. The memory device of claim 1, wherein a time interval when the first stage circuit compares the search data with the plurality of first data is different from a time interval when the second stage circuit compares the search data with the plurality of second data.

17. The memory device of claim 1, wherein when the second stage circuit compares the search data with the plurality of second data, the first stage circuit pre-charges the first global match line.

18. The memory device of claim 1, wherein when the search data is not matched with the plurality of first data, the second stage circuit does not pre-charge the second global match line.

* * * * *